United States Patent
Ryu et al.

(10) Patent No.: US 12,334,159 B2
(45) Date of Patent: *Jun. 17, 2025

(54) METHOD AND CIRCUIT FOR PROVIDING AUXILIARY POWER AND STORAGE DEVICE INCLUDING THE SAME

(71) Applicant: Samsung Electronics Co., Ltd., Suwon-si (KR)

(72) Inventors: Chunghyun Ryu, Suwon-si (KR); Jaewoong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/518,651

(22) Filed: Nov. 24, 2023

(65) Prior Publication Data

US 2024/0096427 A1    Mar. 21, 2024

Related U.S. Application Data

(63) Continuation of application No. 16/846,648, filed on Apr. 13, 2020, now Pat. No. 11,869,602.

(30) Foreign Application Priority Data

Jul. 11, 2019   (KR) .......................... 10-2019-0083951

(51) Int. Cl.
*G11C 5/14*    (2006.01)
*G11C 16/30*   (2006.01)
(Continued)

(52) U.S. Cl.
CPC .............. *G11C 16/30* (2013.01); *G11C 5/141* (2013.01); *H02J 7/0048* (2020.01);
(Continued)

(58) Field of Classification Search
CPC ......... G11C 16/30; G11C 5/141; G11C 5/143; G11C 5/147; H02J 7/0048; H02J 7/0063;
(Continued)

(56) References Cited

U.S. PATENT DOCUMENTS 3,585,482 A   6/1971 Zelina
7,003,620 B2  2/2006 Avraham et al.
(Continued)

FOREIGN PATENT DOCUMENTS

CN   101483391 A   7/2009
CN   101501596 A   8/2009
(Continued)

OTHER PUBLICATIONS

Office Action dated Jun. 26, 2024 for corresponding CN Patent Application No. 202010664783.9.
(Continued)

*Primary Examiner* — Khamdan N. Alrobaie
(74) *Attorney, Agent, or Firm* — Muir Patent Law, PLLC

(57) ABSTRACT

A method of providing an auxiliary power by an auxiliary power supply. The method may include converting an external power to a plurality of charging voltages; charging a charging circuit with a first charging voltage of the plurality of charging voltages; monitoring a voltage of the charging circuit; when capacitance of the charging circuit is less than a first reference capacitance, charging the charging circuit with a second charging voltage of the plurality of charging voltages, the second charging voltage being higher than the first charging voltage by a first voltage amount; and providing an auxiliary power to outside the auxiliary power supply. The auxiliary power may be generated based on the voltage of the charging circuit.

12 Claims, 13 Drawing Sheets

(51) Int. Cl.
*H02J 7/00* (2006.01)
*H02J 7/34* (2006.01)

(52) U.S. Cl.
CPC ...... *H02J 7/0063* (2013.01); *H02J 7/007182* (2020.01); *H02J 7/345* (2013.01); *H02J 2207/50* (2020.01)

(58) Field of Classification Search
CPC .. H02J 7/007182; H02J 7/345; H02J 2207/50; G06F 1/30; G06F 1/28; G06F 13/16; G06F 1/3206
See application file for complete search history.

(56) References Cited

U.S. PATENT DOCUMENTS

| | | | |
|---|---|---|---|
| 7,560,831 B2 | 7/2009 | Whitted et al. | |
| 8,325,502 B2 | 12/2012 | Giombanco et al. | |
| 8,335,940 B2 | 12/2012 | Umezu | |
| 8,680,814 B2 | 3/2014 | Kabasawa et al. | |
| 9,660,483 B2 | 5/2017 | Kim et al. | |
| 10,044,219 B2 | 8/2018 | Na | |
| 10,094,887 B2 | 10/2018 | Lee et al. | |
| 10,099,568 B2 | 10/2018 | Delobel et al. | |
| 2005/0194938 A1 | 9/2005 | Sanpei | |
| 2008/0197814 A1 | 8/2008 | Ozawa et al. | |
| 2011/0018500 A1 | 1/2011 | Takahashi | |
| 2011/0084645 A1 | 4/2011 | Seo | |
| 2011/0210695 A1 | 9/2011 | Kubo | |
| 2011/0304299 A1 | 12/2011 | Zelina et al. | |
| 2011/0316548 A1 | 12/2011 | Ghantous et al. | |
| 2012/0038320 A1 | 2/2012 | Kabasawa et al. | |
| 2012/0326514 A1 | 12/2012 | Kim et al. | |
| 2014/0169115 A1* | 6/2014 | Jeon | G11C 29/028 365/226 |
| 2015/0280459 A1 | 10/2015 | Yagi et al. | |
| 2015/0324140 A1 | 11/2015 | Oh et al. | |
| 2015/0352966 A1 | 12/2015 | Delobel et al. | |
| 2017/0067968 A1* | 3/2017 | Lee | G01R 31/40 |
| 2019/0339761 A1* | 11/2019 | Ryu | G11C 16/30 |

FOREIGN PATENT DOCUMENTS

| | | |
|---|---|---|
| CN | 102377218 A | 3/2012 |
| CN | 104584377 A | 4/2015 |
| CN | 105189190 A | 12/2015 |
| CN | 106230099 A | 12/2016 |
| EP | 2066012 A2 | 6/2009 |
| JP | H09261894 A | 10/1997 |
| JP | 2015204655 A | 11/2015 |

OTHER PUBLICATIONS

Notice of Allowance dated Nov. 1, 2024 for corresponding CN Patent Application No. 202010664783.9.

* cited by examiner

FIG. 7

| CHARGING VOLTAGE (V_C) | THRESHOLD VOLTAGE (V_TH) | REFERENCE TIME (TR) |
|---|---|---|
| V_C1 | V_TH1 | TR1 |
| V_C2 | V_TH2 | TR2 |
| V_C3 | V_TH3 | TR3 |

IVC

FIG. 9

| INITIAL CHARGING VOLTAGE | CHARGING VOLTAGE INCREMENT | THRESHOLD VOLTAGE (V_TH) | REFERENCE TIME (TR) |
|---|---|---|---|
| V_C1 | - | V_TH1 | TR1 |
| | DVC1 | V_TH2 | TR2 |
| | DVC2 | V_TH3 | TR3 |

IVC'

METHOD AND CIRCUIT FOR PROVIDING AUXILIARY POWER AND STORAGE DEVICE INCLUDING THE SAME

CROSS-REFERENCE TO RELATED APPLICATIONS

This application is a Continuation of U.S. patent application Ser. No. 16/846,648 filed on Apr. 13, 2020, now Allowed, which claims the benefit of Korean Patent Application No. 10-2019-0083951, filed on Jul. 11, 2019, in the Korean Intellectual Property Office, the disclosure of each of which is incorporated herein in its entirety by reference.

BACKGROUND

The inventive concept relates to an auxiliary power supply, and more particularly, to a method of providing an auxiliary power of an auxiliary power supply that secondarily supplies power, an auxiliary power supply circuit, and a storage device including the same.

Memory systems including memory devices and a memory controller are usually supplied with an external power when operating the memory systems. Sudden power off (SPO) may occur such that power is abruptly cut off during the operation of memory systems. At this time, since the memory controller stores data using volatile memory, the data stored in the memory may be lost or an operation (e.g., an erase operation or a write operation) performed by a memory device may not be completed. Therefore, memory systems complete an operation using an auxiliary power supply and then back data up.

SUMMARY

The inventive concept provides a method of providing an auxiliary power by an auxiliary power supply, an auxiliary power monitoring circuit, and a storage device including the same.

According to an aspect of the inventive concept, there is provided a method of providing an auxiliary power by an auxiliary power supply. The method includes converting an external power to a plurality of charging voltages; charging a charging circuit with a first charging voltage of the plurality of charging voltages; monitoring a voltage of the charging circuit; when capacitance of the charging circuit is less than a first reference capacitance, charging the charging circuit with a second charging voltage of the plurality of charging voltages, the second charging voltage being higher than the first charging voltage by a first voltage amount; and providing an auxiliary power to outside the auxiliary power supply. The auxiliary power is generated based on the voltage of the charging circuit.

According to another aspect of the inventive concept, there is provided an auxiliary power supply circuit. The auxiliary power supply circuit includes an auxiliary power monitoring circuit configured to provide an auxiliary power to outside the auxiliary power monitoring circuit, and a charging circuit connected to the auxiliary power monitoring circuit. The auxiliary power monitoring circuit includes a converter configured to convert an external power to a charging voltage and to provide the charging voltage to the charging circuit, and a voltage monitoring circuit configured to control the converter based on capacitance of the charging circuit. The voltage monitoring circuit controls the converter to provide a first charging voltage to the charging circuit when the capacitance of the charging circuit is equal to or greater than a first reference capacitance and to control the converter to provide a second charging voltage higher than the first charging voltage to the charging circuit when the capacitance of the charging circuit is less than the first reference capacitance.

According to a further aspect of the inventive concept, there is provided a storage device including an auxiliary power supply including a charging circuit and configured to receive an external power and to generate a main power and an auxiliary power based on the external power, and a main system configured to control an operation of the auxiliary power supply. The auxiliary power supply may charge the charging circuit with a first charging voltage, and when capacitance of the charging circuit is less than a first reference capacitance, the auxiliary power supply may charge the charging circuit with a second charging voltage higher level than the first charging voltage.

BRIEF DESCRIPTION OF THE DRAWINGS

Embodiments of the inventive concept will be more clearly understood from the following detailed description taken in conjunction with the accompanying drawings in which:

FIG. 7 is a diagram for explaining charging voltage information stored in an auxiliary power supply, according to an example embodiment;

FIG. 9 is a diagram for explaining charging voltage information stored in an auxiliary power supply, according to an example embodiment;

DETAILED DESCRIPTION OF THE EMBODIMENTS

Figure 1:
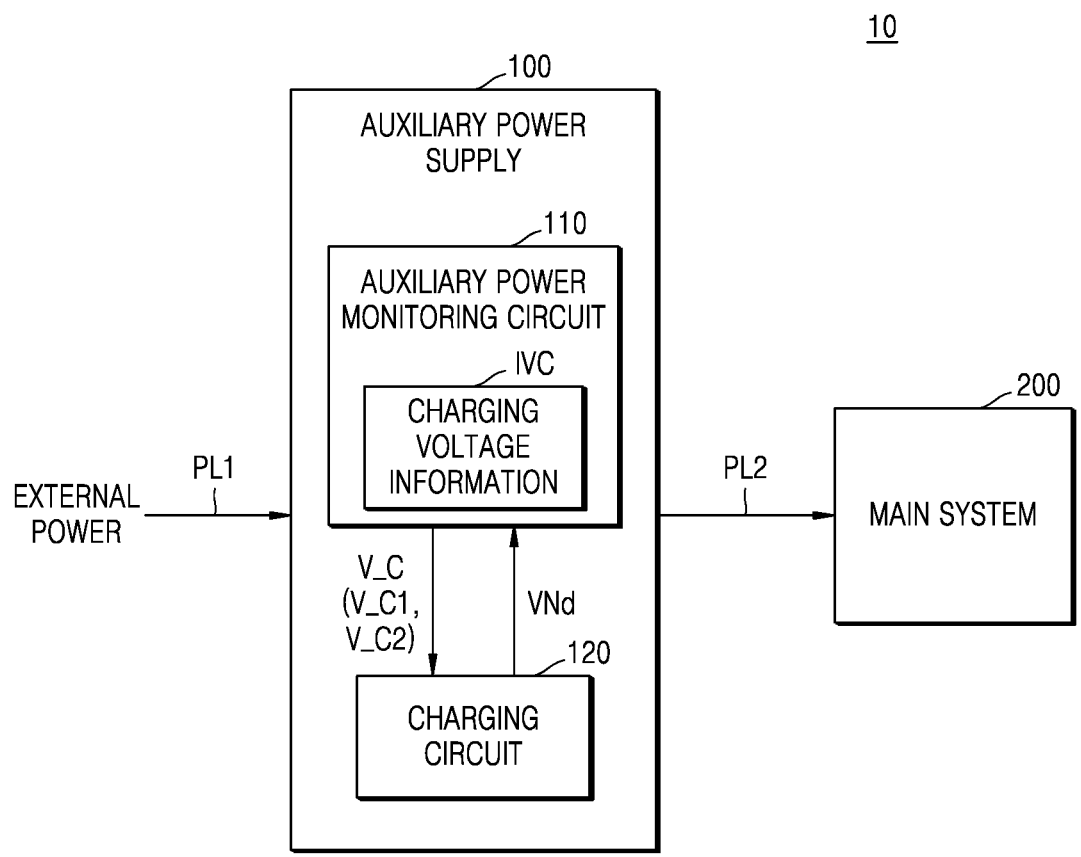
FIG. 1 is a block diagram of an electronic device according to an example embodiment.

Embodiments will be described in detail with reference to the attached drawings. In the drawings, like reference numerals denote like elements, and redundant descriptions thereof will be omitted.

FIG. 1 is a block diagram of an electronic device 10 according to an example embodiment.

Referring to FIG. 1, the electronic device 10 may include an auxiliary power supply (or, an auxiliary power supply circuit) 100 and a main system 200. The auxiliary power supply 100 may supply an auxiliary power to the main system 200, and the main system 200 may perform an operation using the auxiliary power.

In an example embodiment, the electronic device 10 may include a storage device. For example, the electronic device 10 may include a solid state drive (SSD). When the electronic device 10 includes an SSD, the electronic device 10 may include a plurality of flash memory chips (e.g., NAND memory chips) storing data.

The electronic device 10 may include a flash memory device including at least one flash memory chip. In an example embodiment, the electronic device 10 may include an embedded multi-media card (eMMC) or an embedded universal flash storage (UFS) memory device. In an example embodiment, the electronic device 10 may include a UFS memory card, a compact flash (CF) card, a secure digital (SD) card, a micro-SD card, a mini-SD card, an extreme digital (xD) card, or a memory stick. However, the electronic device 10 is not limited to a memory system.

The auxiliary power supply 100 may perform an operation of repeatedly charging electric energy using an external power (or, an external voltage) supplied through a first power line PL1 and an operation of supplying the auxiliary power to a second power line PL2 based on the charged electric energy. A system including the main system 200 may operate using the power supplied through the second power line PL2.

The auxiliary power supply 100 may include an auxiliary power monitoring circuit 110 and a charging circuit 120. The auxiliary power monitoring circuit 110 may store electric energy in the charging circuit 120 using external power and monitor the charging circuit 120. In an example embodiment, the charging circuit 120 may include at least one capacitor.

The auxiliary power monitoring circuit 110 may charge electric energy in the charging circuit 120 (e.g., may cause electric energy to be stored by the charging circuit 120) using the external power while the external power is being normally supplied to the auxiliary power supply 100. The auxiliary power monitoring circuit 110 may enable the external power to be output to the second power line PL2 as a main power (or, a main voltage) and block an auxiliary power (or, an auxiliary voltage) charged in the charging circuit 120 from being output to the second power line PL2.

When external power is not normally supplied to the auxiliary power supply 100, the auxiliary power monitoring circuit 110 may block the main power from being output to the second power line PL2 and enable the auxiliary power in the charging circuit 120 to be output to the second power line PL2. For example, when sudden power off (SPO) occurs and power is abruptly cut off during the operation of the electronic device 10, external power may not be normally supplied to the auxiliary power supply 100 through the first power line PL1. For example, SPO may occur when the voltage level of the main power is lower than an initially-set minimum operation enabling voltage level.

The auxiliary power monitoring circuit 110 may monitor the charging circuit 120. For example, the auxiliary power monitoring circuit 110 may monitor the voltage of the charging circuit 120. In an example embodiment, the auxiliary power monitoring circuit 110 may measure a voltage VNd of the charging circuit 120 and monitor a change in capacitance using the measured voltage.

The auxiliary power monitoring circuit 110 may control a charging voltage V_C of the charging circuit 120 according to the change in capacitance of the charging circuit 120. The auxiliary power monitoring circuit 110 may control the level of the charging voltage V_C to increase when the capacitance of the charging circuit 120 decreases. For example, the auxiliary power monitoring circuit 110 may primarily charge the charging circuit 120 with a first charging voltage V_C1 and, when the capacitance of the charging circuit 120 decreases, may charge the charging circuit 120 with a second charging voltage V_C2. At this time, the level of the second charging voltage V_C2 may be higher than the level of the first charging voltage V_C1. Levels of the first and second charging voltages V_C1 and V_C2 may be predetermined.

In an example embodiment, charging voltage information IVC, i.e., information about the charging voltage V_C with respect to the change in capacitance of the charging circuit 120, may be stored in the auxiliary power monitoring circuit 110. The auxiliary power monitoring circuit 110 may control the charging voltage V_C, which is provided to the charging circuit 120, based on the charging voltage information IVC. However, embodiments are not limited thereto. The charging voltage information IVC may be stored in a controller included in the main system 200, and the auxiliary power monitoring circuit 110 may control the charging voltage V_C, which is provided to the charging circuit 120, in response to a control signal (e.g., a charging voltage change command) from the controller of the main system 200.

The main system 200 may operate using power supplied through the second power line PL2. For example, when external power is normally supplied to the first power line PL1, the main system 200 may be supplied with the external power as the main power through the second power line PL2. Contrarily, when the external power is not normally supplied to the first power line PL1, the main system 200 may be supplied with the auxiliary power through the second power line PL2.

The main system 200 may include hardware or software, each for controlling the auxiliary power supply 100. An example of the configuration of the main system 200 will be described below with reference to FIG. 4.

As the capacitance of the charging circuit 120 decreases, electric energy stored in the charging circuit 120 may also decrease according to Equation 1:

$$E = \frac{1}{2}CV^2 \qquad \text{[Equation 1]}$$

where E is electric energy stored in the charging circuit 120, C is equivalent capacitance of the charging circuit 120, and V is the charging voltage V_C of the charging circuit 120. Hereinafter, the capacitance of the charging circuit 120 may refer to the equivalent capacitance of the charging circuit 120. Accordingly, the auxiliary power supply 100 may prevent electric energy stored in the charging circuit 120 from decreasing by increasing the charging voltage V_C of the charging circuit 120 when the capacitance of the charging circuit 120 decreases.

Figure 2:
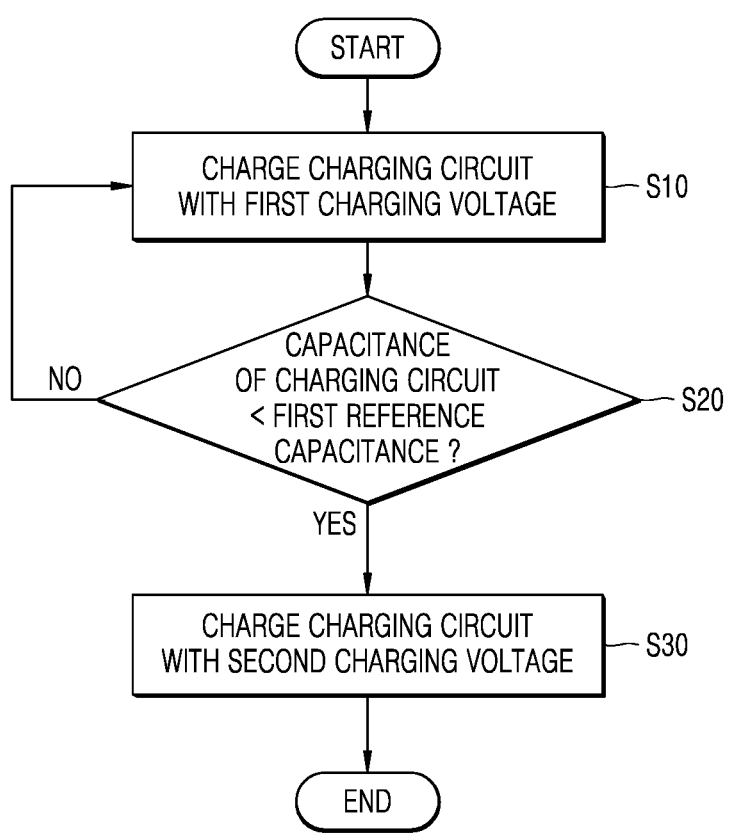
FIG. 2 is a flowchart of the monitoring operation of an auxiliary power supply of an electronic device, according to an example embodiment.

FIG. 2 is a flowchart of the monitoring operation of the auxiliary power supply 100 of the electronic device 10, according to an example embodiment.

In an example embodiment, the monitoring operation of FIG. 2 may be performed on the charging circuit 120 by the auxiliary power supply 100 when the external power is normally supplied to the electronic device 10 through the first power line PL1.

Referring to FIG. 2, the auxiliary power supply 100 may charge the charging circuit 120 with the first charging voltage V_C1 in operation S10. The voltage VNd of the charging circuit 120 may gradually increase and reach the first charging voltage V_C1.

The auxiliary power supply 100 may determine whether capacitance of the charging circuit 120 is less than a first reference capacitance in operation S20. In an example embodiment, the auxiliary power monitoring circuit 110 may measure a discharge time, during which the voltage VNd of the charging circuit 120 decreases while the charging circuit 120 is being discharged, and compare the discharge time with a first reference time, thereby determining whether the capacitance of the charging circuit 120 is less than the first reference capacitance. In an example embodiment, when the auxiliary power supply 100 receives a control signal (e.g., a charging voltage change command CMD_VC in FIG. 9) from a controller of the main system 200, the auxiliary power supply 100 may determine that the capacitance of the charging circuit 120 is less than the first reference capacitance.

When it is determined that the capacitance of the charging circuit 120 is equal to or greater than the first reference capacitance, the auxiliary power supply 100 may newly perform operation S10. The auxiliary power supply 100 may newly charge the charging circuit 120 with the first charging voltage V_C1.

Otherwise, when it is determined that the capacitance of the charging circuit 120 is less than the first reference capacitance, the auxiliary power supply 100 may charge the charging circuit 120 with the second charging voltage V_C2 in operation S30. The voltage VNd of the charging circuit 120 may gradually increase and reach the second charging voltage V_C2. At this time, the level of the second charging voltage V_C2 may be higher than the level of the first charging voltage V_C1.

Although it has been described that the auxiliary power supply 100 charges the charging circuit 120 with the first charging voltage V_C1 or the second charging voltage V_C2, embodiments are not limited thereto. An operation of charging the charging circuit 120 with a third charging voltage, of which the level is higher than the level of the second charging voltage V_C2, may be additionally performed.

In an example embodiment, after operation S30, the auxiliary power supply 100 may determine whether the capacitance of the charging circuit 120 is less than a second reference capacitance. In an example embodiment, the auxiliary power monitoring circuit 110 may measure a discharge time, during which the voltage VNd of the charging circuit 120 decreases while the charging circuit 120 is being discharged, and compare the discharge time with a second reference time, thereby determining whether the capacitance of the charging circuit 120 is less than the second reference capacitance. In an example embodiment, when the auxiliary power supply 100 receives a control signal from a controller of the main system 200, the auxiliary power supply 100 may determine that the capacitance of the charging circuit 120 is less than the second reference capacitance. At this time, the second reference capacitance may be less than the first reference capacitance.

When it is determined that the capacitance of the charging circuit 120 is less than the second reference capacitance, the auxiliary power supply 100 may charge the charging circuit 120 with the third charging voltage. At this time, the level of the third charging voltage may be higher than the level of the second charging voltage V_C2.

Figure 3:
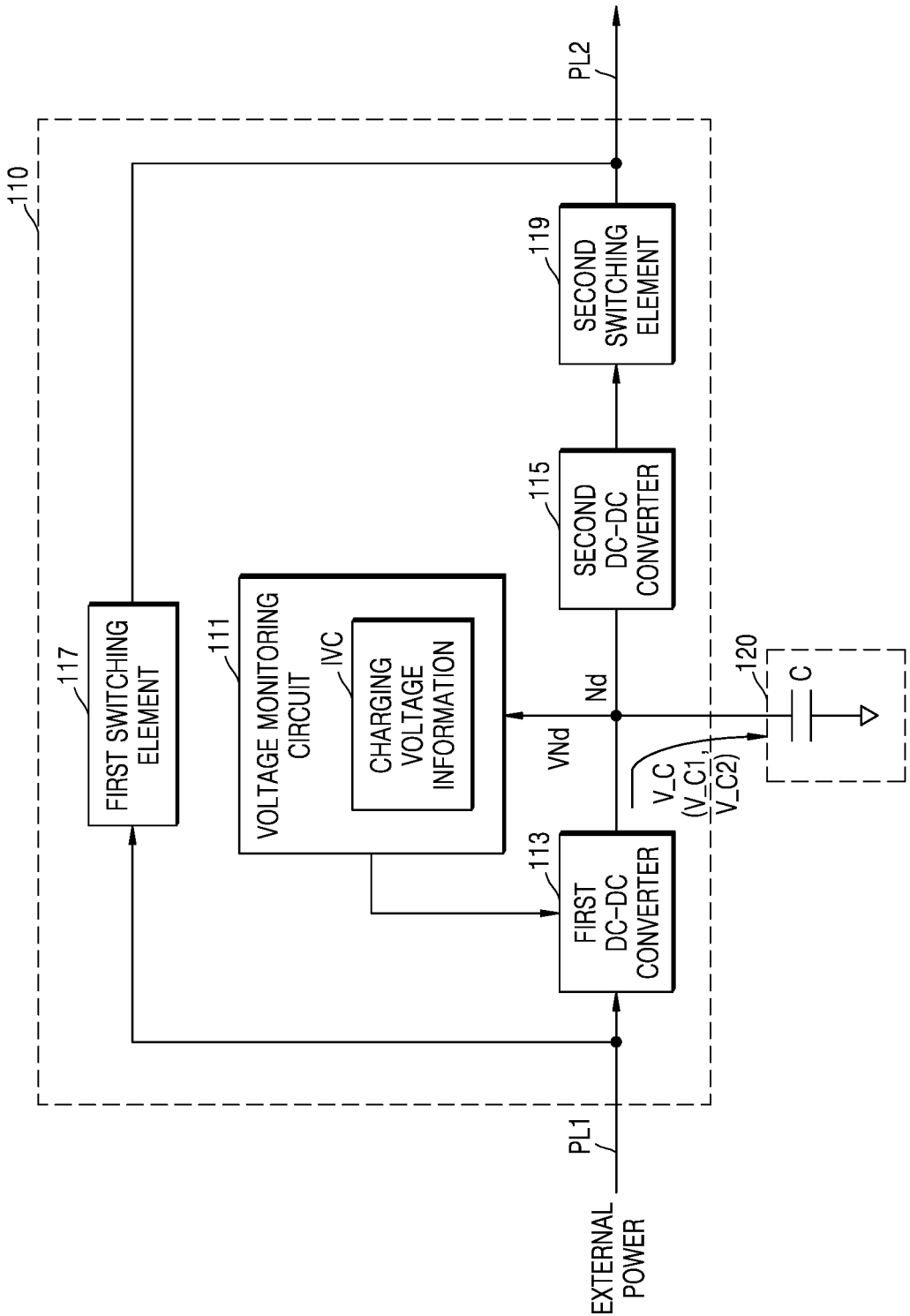
FIG. 3 is a block diagram of an auxiliary power supply of an electronic device, according to an example embodiment.

FIG. 3 is a block diagram of the auxiliary power supply 100 of the electronic device 10, according to an example embodiment.

Referring to FIG. 3, the auxiliary power supply 100 may include the auxiliary power monitoring circuit 110 and the charging circuit 120. The auxiliary power supply 100 may supply the main power or the auxiliary power to the main system 200.

In an example embodiment, the charging circuit 120 may include at least one capacitor. Although only one capacitor is illustrated in FIG. 3, embodiments are not limited thereto. For convenience of description, a single capacitor having an equivalent capacitance C is illustrated as an example. The charging circuit 120 may be charged with the charging voltage V_C provided through a first direct current (DC)-DC converter 113.

The auxiliary power monitoring circuit 110 may include a voltage monitoring circuit 111, the first DC-DC converter 113, a second DC-DC converter 115, a first switching circuit 117, and a second switching circuit 119. The auxiliary power monitoring circuit 110 may monitor a change in the voltage VNd of the charging circuit 120.

The voltage monitoring circuit 111 may monitor the voltage VNd of the charging circuit 120, i.e., a node voltage of a node Nd connected to the charging circuit 120. The voltage monitoring circuit 111 may control the first DC-DC converter 113 such that the charging voltage V_C output from the first DC-DC converter 113 is changed according to the voltage VNd of the charging circuit 120. In an example embodiment, the voltage monitoring circuit 111 may include a micro controller unit (MCU).

In an example embodiment, the charging voltage information IVC, i.e., information about the charging voltage V_C with respect to the change in the capacitance C of the charging circuit 120, may be stored in the voltage monitoring circuit 111. The voltage monitoring circuit 111 may control the first DC-DC converter 113 based on the charging voltage information IVC such that the charging voltage V_C corresponding to the capacitance C of the charging circuit 120 is provided to the charging circuit 120.

The first DC-DC converter 113 may convert external power to the charging voltage V_C and provide the charging voltage V_C to the charging circuit 120. When the first DC-DC converter 113 is used, the amount of electric energy charged in the charging circuit 120 may increase. In an example embodiment, the first DC-DC converter 113 may include a boost converter.

The first DC-DC converter 113 may convert external power to the first charging voltage V_C1 and provide the first charging voltage V_C1 to the charging circuit 120. When the capacitance C of the charging circuit 120 is less than the first reference capacitance, the first DC-DC converter 113 may provide the second charging voltage V_C2, of which the level is higher than the level of the first charging voltage V_C1, to the charging circuit 120. In an example embodiment, when the capacitance C of the charging circuit 120 is less than the second reference capacitance, the first DC-DC converter 113 may provide a third charging voltage, of which the level is higher than the level of the second charging voltage V_C2, to the charging circuit 120.

The second DC-DC converter 115 may be connected between the charging circuit 120 and the second switching circuit 119. The second DC-DC converter 115 may change the level of the voltage VNd provided by the charging circuit 120. For example, the second DC-DC converter 115 may convert the voltage VNd into an auxiliary voltage, which is suitable to a main system (e.g., the main system 200 in FIG.

1), and output the auxiliary voltage to the second switching circuit 119. In an example embodiment, the second DC-DC converter 115 may include a buck converter.

The first switching circuit 117 may transmit external power, which is supplied through the first power line PL1, to the main system 200 through the second power line PL2. While the external power is being normally supplied to the auxiliary power supply 100, the first switching circuit 117 may be turned on such that the external power is output to the second power line PL2 as the main power. When the external power is not normally supplied to the auxiliary power supply 100, the first switching circuit 117 may be turned off and the external power may be blocked from being output to the second power line PL2.

The second switching circuit 119 may transmit the auxiliary voltage from the second DC-DC converter 115 to the main system 200 through the second power line PL2. While external power is being normally supplied to the auxiliary power supply 100, the second switching circuit 119 may be turned off (e.g., in an open state) and the auxiliary voltage may be blocked from being output to the second power line PL2. When the external power is not normally supplied to the auxiliary power supply 100, the second switching circuit 119 may be turned on (e.g., in a closed state) and the auxiliary voltage may be output to the second power line PL2.

In an example embodiment, the auxiliary power monitoring circuit 110 may be implemented by a single chip. For example, the auxiliary power monitoring circuit 110 may form a power loss protection (PLP) integrated circuit (IC). In an example embodiment, the charging circuit 120 may be included in or separated from the PLP IC.

Figure 4:
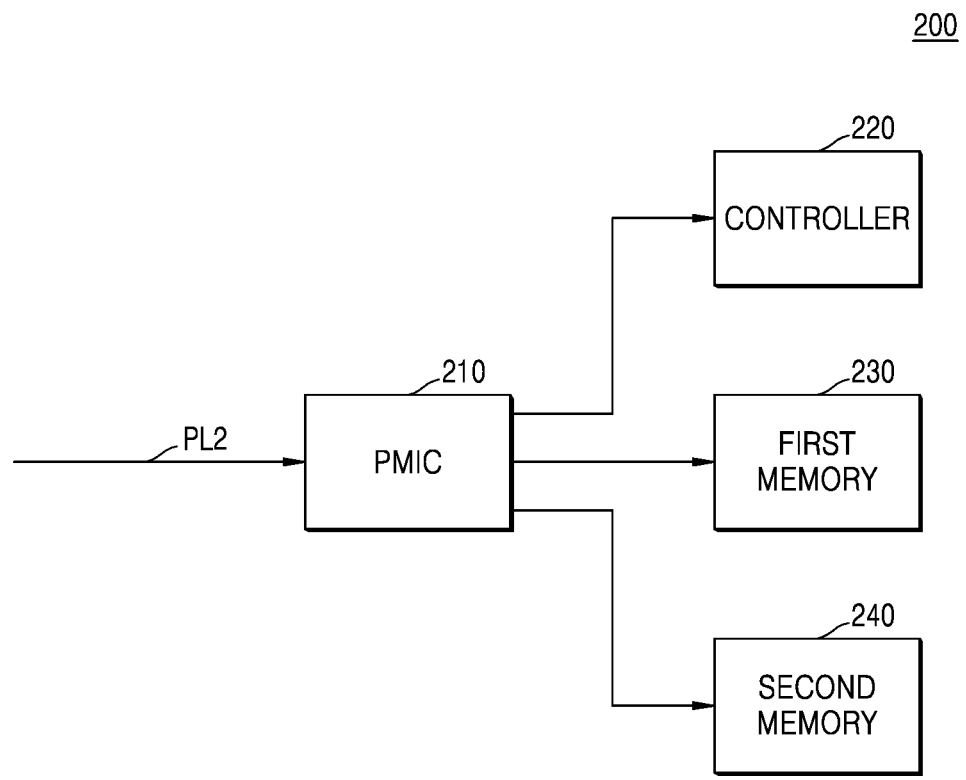
FIG. 4 is a block diagram of a main system of an electronic device, according to an example embodiment.

FIG. 4 is a block diagram of the main system 200 of the electronic device 10, according to an example embodiment.

Referring to FIG. 4, the main system 200 may include a power management circuit 210, a controller 220, a first memory 230, and a second memory 240. In an example embodiment, the power management circuit 210 may include a power management IC (PMIC).

The power management circuit 210 may receive the main power or the auxiliary power from the second power line PL2, may generate output voltages respectively suitable to the operations of the controller 220, the first memory 230, and the second memory 240, and may respectively provide the output voltages to the controller 220, the first memory 230, and the second memory 240.

The controller 220 may control the operation, e.g., data read, data write, or data erase, of the first memory 230 and the second memory 240. The controller 220 may also control the operation of an auxiliary power supply circuit (e.g., the auxiliary power supply 100 in FIG. 1). In an example embodiment, the controller 220 may receive information about capacitance of a charging circuit (e.g., the charging circuit 120 in FIG. 1) and, when the capacitance of the charging circuit 120 is less than a first reference capacitance, may control the auxiliary power supply circuit to increase a charging voltage supplied to the charging circuit 120.

In an example embodiment, the controller 220 may include a processor and a working memory and may control the auxiliary power supply 100 through a firmware operation. However, embodiments are not limited thereto, and the controller 220 may control the auxiliary power supply 100 through a hardware or software operation.

In an example embodiment, the first memory 230 may be a different type from the second memory 240. For example, the first memory 230 may be a volatile memory and the second memory 240 may be a non-volatile memory.

For example, the first memory 230 may be implemented as static random access memory (SRAM), dynamic RAM (DRAM), etc. The second memory 240 may be implemented as flash memory, phase-change RAM (PRAM), ferroelectric RAM (FRAM), magnetic RAM (MRAM), etc.

In an example embodiment, one of the first memory 230 and the second memory 240 may be a cache memory and the other may be a main memory. According to the type of main memory, an electronic device (e.g., the electronic device 10 of FIG. 1) may be an SSD. For example, in the case of an SSD, DRAM may be used as a cache memory and NAND flash memory may be used as a main memory. However, embodiments are not limited to the case where the electronic device 10 is an SSD.

Figure 5:
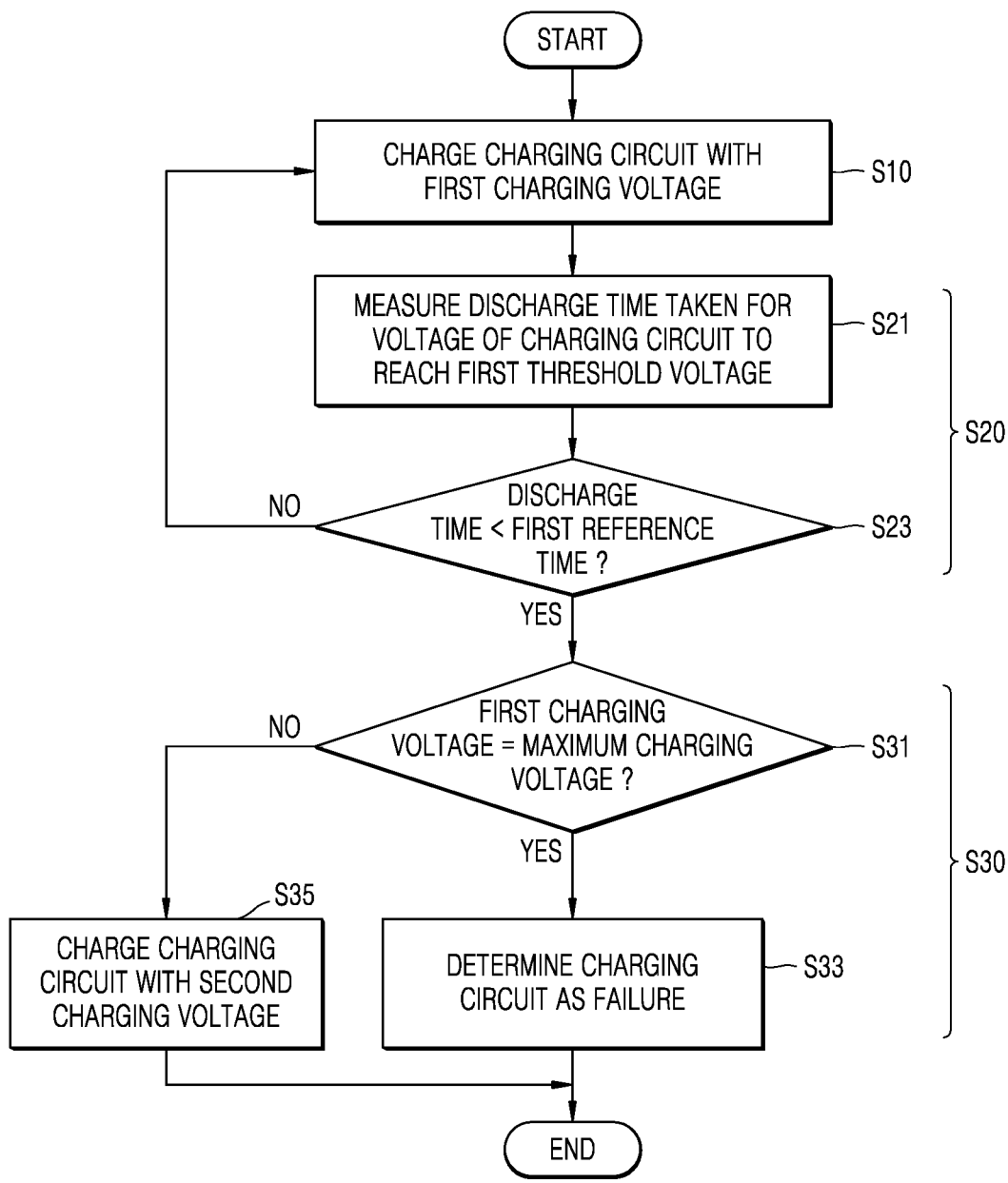
FIG. 5 is a flowchart of the monitoring operation of an auxiliary power supply of an electronic device, according to an example embodiment.
Figure 6:
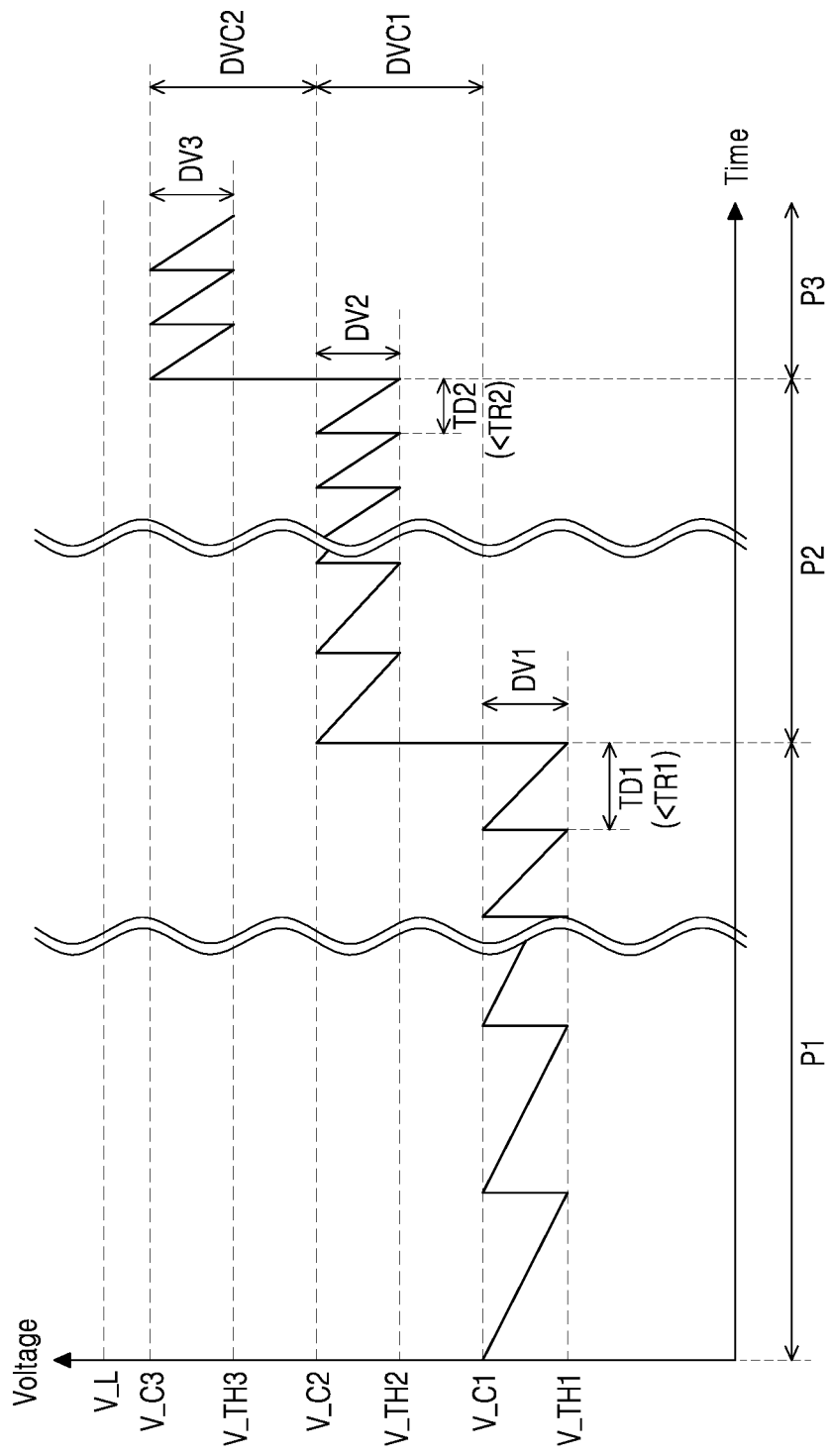
FIG. 6 is a graph showing a change in the voltage of a charging circuit over time.

FIG. 5 is a flowchart of the monitoring operation of the auxiliary power supply 100 of the electronic device 10, according to an example embodiment. FIG. 6 is a graph showing a change in the voltage of a charging circuit over time and is provided to explain the operation of the auxiliary power supply 100. Redundant descriptions of like numerals in FIGS. 2 and 5 will be omitted. In an example embodiment, the monitoring operation of FIG. 5 may be performed on the charging circuit 120 by the auxiliary power supply 100 when the external power is normally supplied to the electronic device 10.

Referring to FIGS. 1, 5, and 6, operation S20 may include operation S21 and operation S23. The auxiliary power supply 100 may measure a discharge time, which is taken for the charging circuit 120 to be discharged from the first charging voltage V_C1 to a first threshold voltage V_TH1, in operation S20. For example, a level of the first threshold voltage V_TH1 may be lower than the level of the first charging voltage V_C1 by a first discharge voltage amount DV1.

The auxiliary power supply 100 may determine whether the discharge time is less than a first reference time interval TR1 in operation S23. The smaller the capacitance of the charging circuit 120, the faster the electric energy stored in the charging circuit 120 may be discharged. For example, when the discharge time taken for the charging circuit 120 to be discharged from the first charging voltage V_C1 to the first threshold voltage V_TH1 decreases, the capacitance of the charging circuit 120 may also be lower. Accordingly, when the discharge time of the charging circuit 120 is measured and compared with a reference time, whether the capacitance of the charging circuit 120 is less than the first reference capacitance may be determined.

When the discharge time is equal to or longer than the first reference time interval TR1, the auxiliary power supply 100 may newly perform operation S10.

When a first discharge time, e.g., TD1, is shorter than the first reference time interval TR1, the auxiliary power supply 100 may perform operation S30. Operation S30 may include operations S31, S33, and S35.

The auxiliary power supply 100 may determine whether the first charging voltage V_C1 is a maximum charging voltage in operation S31. The level of the charging voltage V_C of the charging circuit 120 may be preset, and the maximum charging voltage may be the maximum value of the charging voltage V_C that guarantees the normal operation of the charging circuit 120. When the charging circuit 120 is charged with a voltage that is higher than an upper limit voltage V_L, the charging circuit 120 may be degraded and may thus not normally operate, and the level of the maximum charging voltage may be equal to or lower than the level of the upper limit voltage V_L.

When the first charging voltage V_C1 is the maximum charging voltage, the auxiliary power supply 100 may determine the charging circuit 120 to be a failure in operation S33. The auxiliary power supply 100 may inform outside the electronic device 10, for example, a host, of the failure of the charging circuit 120. The electronic device 10 may not use the auxiliary power supply 100 based on information of failure. When the first charging voltage V_C1 is the maximum charging voltage, it is difficult to guarantee the normal operation of the charging circuit 120 even if the charging circuit 120 is charged with a voltage that is higher than the first charging voltage V_C1, and therefore, the charging circuit 120 may be determined to be a failure.

When the first charging voltage V_C1 is not the maximum charging voltage, the auxiliary power supply 100 may charge the charging circuit 120 with the second charging voltage V_C2 in operation S35. At this time, the level of the second charging voltage V_C2 may be higher than the level of the first charging voltage V_C1 by a first voltage amount DVC1.

Although an example, in which the auxiliary power supply 100 charges the charging circuit 120 with the first charging voltage V_C1 or the second charging voltage V_C2, has been described with reference to FIG. 5, embodiments are not limited thereto.

After operation S30, the auxiliary power supply 100 may measure a discharge time, which is taken for the charging circuit 120 to be discharged from the second charging voltage V_C2 to a second threshold voltage V_TH2. The auxiliary power supply 100 may determine whether the discharge time is less than a second reference time interval TR2. Since a voltage decrement of the charging circuit 120 (i.e., an absolute value of a declining slope) increases over time, the second reference time interval TR2 may be shorter than the first reference time interval TR1 in an example embodiment.

The level of the second threshold voltage V_TH2 may be lower than the level of the second charging voltage V_C2 by a second discharge voltage amount DV2. In an example embodiment, the magnitude of the first discharge voltage DV1 may be equal to the magnitude of the second discharge voltage DV2. However, embodiments are not limited thereto, and the magnitude of the first discharge voltage DV1 may be different from the magnitude of the second discharge voltage DV2. For example, since the voltage decrement of the charging circuit 120 increases over time, the magnitude of the second discharge voltage DV2 may be set to be higher than the magnitude of the first discharge voltage DV1.

When a second discharge time, e.g., TD2, is shorter than the second reference time interval TR2, the auxiliary power supply 100 may determine whether the second charging voltage V_C2 is the maximum charging voltage.

When the second charging voltage V_C2 is the maximum charging voltage, the auxiliary power supply 100 may determine the charging circuit 120 to be a failure. The auxiliary power supply 100 may inform outside the electronic device 10, for example, a host, of the failure of the charging circuit 120.

When the second charging voltage V_C2 is not the maximum charging voltage, the auxiliary power supply 100 may charge the charging circuit 120 with a third charging voltage V_C3.

At this time, the level of the third charging voltage V_C3 may be higher than the level of the second charging voltage V_C2 by a second voltage amount DVC2. In an example embodiment, the magnitude of the first voltage DVC1 may be equal to the magnitude of the second voltage DVC2. However, embodiments are not limited thereto, and the magnitude of the first voltage DVC1 may be different from the magnitude of the second voltage DVC2.

In an example embodiment, the auxiliary power supply 100 may control charge and discharge of the charging circuit 120 such that the voltage of the charging circuit 120 has a value between the third charging voltage V_C3 and a third threshold voltage V_TH3. The level of the third threshold voltage V_TH3 may be lower than the level of the third charging voltage V_C3 by a third discharge voltage DV3. In an example embodiment, the magnitude of the second discharge voltage DV2 may be equal to the magnitude of the third discharge voltage DV3. However, embodiments are not limited thereto, and the magnitude of the second discharge voltage DV2 may be different from the magnitude of the third discharge voltage DV3. For example, since the voltage decrement of the charging circuit 120 increases over time, the magnitude of the third discharge voltage DV3 may be set to be greater than the magnitude of the second discharge voltage DV2.

The auxiliary power supply 100 may prevent electric energy stored in the charging circuit 120 from decreasing due to the degradation of a capacitor by increasing a charging voltage of the charging circuit 120 in stages as capacitance of the charging circuit 120 gradually decreases.

FIG. 7 is a diagram for explaining the charging voltage information IVC stored in the auxiliary power supply 100, according to an example embodiment.

Referring to FIGS. 6 and 7, the charging voltage information IVC, i.e., information about the charging voltage V_C with respect to the change in capacitance of a charging circuit, may be stored in the auxiliary power supply 100. In an example embodiment, the charging voltage information IVC may include information about the charging voltage V_C, a threshold voltage V_TH, and a reference time TR.

In a first period P1, the auxiliary power supply 100 may repeatedly perform an operation of charging the charging circuit up to the first charging voltage V_C1 and an operation of discharging the charging circuit down to the first threshold voltage V_TH1 based on the charging voltage information IVC. When the first discharge time taken for the charging circuit to be discharged from the first charging voltage V_C1 to the first threshold voltage V_TH1 is shorter than the first reference time interval TR1, the auxiliary power supply 100 may charge the charging circuit with the second charging voltage V_C2. In an example embodiment, when the first discharge time is shorter than the second reference time interval TR2, the auxiliary power supply 100 may skip a stage of charging the charging circuit with the second charging voltage V_C2 and immediately charge the charging circuit with the third charging voltage V_C3.

In a second period P2, the auxiliary power supply 100 may repeatedly perform an operation of charging the charging circuit up to the second charging voltage V_C2 and an operation of discharging the charging circuit down to the second threshold voltage V_TH2 based on the charging voltage information IVC. When the second discharge time taken for the charging circuit to be discharged from the second charging voltage V_C2 to the second threshold voltage V_TH2 is shorter than the second reference time interval TR2, the auxiliary power supply 100 may charge the charging circuit up to the third charging voltage V_C3.

In a third period P3, the auxiliary power supply 100 may repeatedly perform an operation of charging the charging circuit up to the third charging voltage V_C3 and an operation of discharging the charging circuit down to the third threshold voltage V_TH3 based on the charging voltage information IVC. When a third discharge time taken for the charging circuit to be discharged from the third charging voltage V_C3 to the third threshold voltage V_TH3 is shorter than a third reference time interval TR3, the auxiliary power supply 100 may determine the charging circuit to be a failure. The electronic device 10 may not use the auxiliary power supply 100 based on information of failure. Although an example in which the third charging voltage V_C3 is the maximum charging voltage has been described for convenience's sake, embodiments are not limited thereto. In the case where the charging voltage information IVC further includes information about a fourth charging voltage having a higher level than the third charging voltage V_C3, the auxiliary power supply 100 may charge the charging circuit up to the fourth charging voltage when the third discharge time taken for the charging circuit to be discharged from the third charging voltage V_C3 to the third threshold voltage V_TH3 is shorter than the third reference time interval TR3.

In an example embodiment, the level may gradually increase from the first charging voltage V_C1 to the third charging voltage V_C3. The level may gradually increase from the first threshold voltage V_TH1 to the third threshold voltage V_TH3. In addition, the length may gradually decrease from the first reference time interval TR1 to the third reference time interval TR3.

In the drawings, the charging voltage information IVC includes the first through third charging voltages V_C1 through V_C3 respectively having different levels, the first through third threshold voltages V_TH1 through V_TH3 respectively corresponding to the first through third charging voltages V_C1 through V_C3 and respectively having different levels, and the first through third reference time intervals TR1 through TR3 respectively corresponding to the first through third charging voltages V_C1 through V_C3. However, this is just for convenience of description, and the number of charging voltages respectively having different levels, the number of threshold voltages respectively having different levels, and the number of reference times respectively having different lengths in the charging voltage information IVC may be two or at least four.

Figure 8:
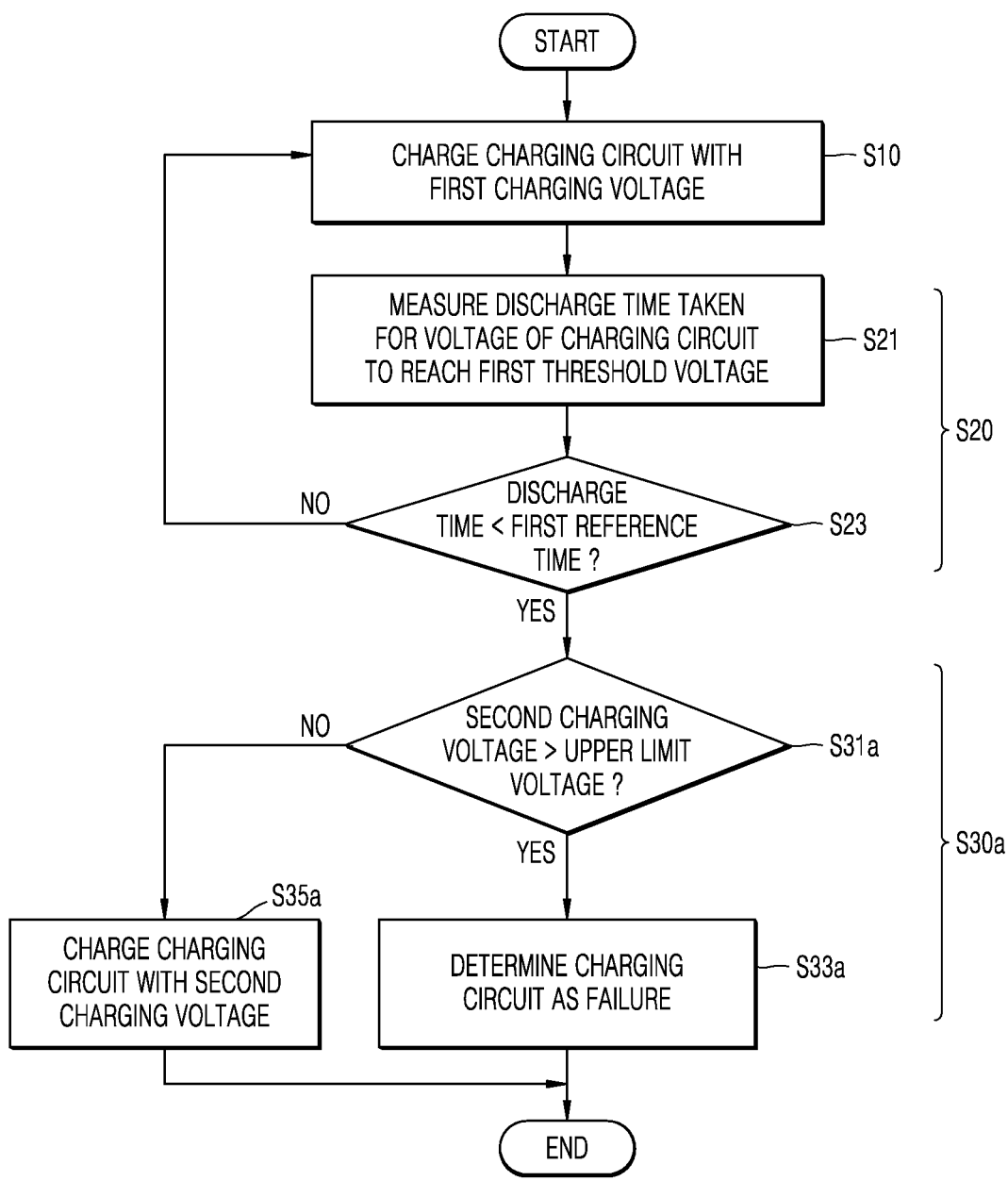
FIG. 8 is a flowchart of the monitoring operation of an auxiliary power supply of an electronic device, according to an example embodiment.

FIG. 8 is a flowchart of the monitoring operation of the auxiliary power supply 100 of the electronic device 10, according to an example embodiment. Redundant descriptions of like numerals in FIGS. 2, 5, and 8 will be omitted. In an example embodiment, the monitoring operation of FIG. 8 may be performed on the charging circuit 120 by the auxiliary power supply 100 when external power is normally supplied to the electronic device 10.

Referring to FIGS. 1, 6, and 8, when a discharge time, e.g., TD1, is shorter than the first reference time interval TR1 in operation S23, the auxiliary power supply 100 may perform operation S30a. Operation S30a may include operations S31a, S33a, and S35a.

The auxiliary power supply 100 may determine whether the second charging voltage V_C2 is higher than the upper limit voltage V_L in operation S31a. The auxiliary power supply 100 may calculate the second charging voltage V_C2 by adding the first voltage amount DVC1 having a predetermined value to the first charging voltage V_C1, and then compare the second charging voltage V_C2 with the upper limit voltage V_L. The upper limit voltage V_L may have a level that allows the charging circuit 120 to normally operate and may have a predetermined value. When the charging circuit 120 is overcharged exceeding the upper limit voltage V_L, a normal operation of the charging circuit 120 may not be guaranteed.

When the second charging voltage V_C2 is higher than the upper limit voltage V_L, the auxiliary power supply 100 may determine the charging circuit 120 to be a failure in operation S33a. The auxiliary power supply 100 may inform outside the electronic device 10, for example, a host, of the failure of the charging circuit 120.

When the second charging voltage V_C2 is equal to or lower than the upper limit voltage V_L, the auxiliary power supply 100 may charge the charging circuit 120 with the second charging voltage V_C2, which has a level higher than the level of the first charging voltage V_C1 by the first voltage amount DVC1, in operation S35a.

In an example embodiment, the first charging voltage V_C1 may be the charging voltage V_C with which the charging circuit 120 is initially charged, and the first voltage DVC1 may have a predetermined value.

Although an example, in which the auxiliary power supply 100 charges the charging circuit 120 with the first charging voltage V_C1 or the second charging voltage V_C2, has been described with reference to FIG. 8, embodiments are not limited thereto.

After operation S30a, the auxiliary power supply 100 may measure a discharge time, which is taken for the charging circuit 120 to be discharged from the second charging voltage V_C2 to the second threshold voltage V_TH2. When a second discharge time, e.g., TD2, is shorter than the second reference time interval TR2, the auxiliary power supply 100 may determine whether the third charging voltage V_C3 is equal to or higher than the upper limit voltage V_L. The auxiliary power supply 100 may calculate the third charging voltage V_C3 by adding the second voltage amount DVC2 having a predetermined value to the second charging voltage V_C2, and then compare the third charging voltage V_C3 with the upper limit voltage V_L.

When the voltage of the third charging voltage V_C3 is equal to or higher than the upper limit voltage V_L, the auxiliary power supply 100 may determine the charging circuit 120 to be a failure. The auxiliary power supply 100 may inform outside the electronic device 10, for example, a host, of the failure of the charging circuit 120.

When the third charging voltage V_C3 is equal to or lower than the upper limit voltage V_L, the auxiliary power supply 100 may charge the charging circuit 120 with a third charging voltage V_C3.

In an example embodiment, the magnitude of the first voltage DVC1 may be equal to the magnitude of the second voltage DVC2. In other words, the second charging voltage V_C2 may increase to the third charging voltage V_C3 by the same level width as the first charging voltage V_C1 increases to the second charging voltage V_C2. However, embodiments are not limited thereto, and the magnitude of the first voltage DVC1 may be different from the magnitude of the second voltage DVC2.

FIG. 9 is a diagram for explaining charging voltage information IVC' stored in the auxiliary power supply 100, according to an example embodiment.

Referring to FIGS. 6 and 9, the charging voltage information IVC', i.e., information about the charging voltage V_C with respect to the change in capacitance of a charging circuit, may be stored in the auxiliary power supply 100. In an example embodiment, the charging voltage information IVC' may include information about an initial charging voltage, a charging voltage increment, the threshold voltage V_TH, and the reference time TR.

In the first period P1, the auxiliary power supply 100 may repeatedly perform an operation of charging the charging circuit up to the initial charging voltage, i.e., the first charging voltage V_C1, and an operation of discharging the charging circuit down to the first threshold voltage V_TH1 based on the charging voltage information IVC'. When the first discharge time taken for the charging circuit to be discharged from the first charging voltage V_C1 to the first threshold voltage V_TH1 is shorter than the first reference time interval TR1, the auxiliary power supply 100 may charge the charging circuit up to the second charging voltage V_C2 that is higher than the first charging voltage V_C1 by the first voltage amount DVC1.

In the second period P2, the auxiliary power supply 100 may repeatedly perform an operation of charging the charging circuit up to the second charging voltage V_C2 and an operation of discharging the charging circuit down to the second threshold voltage V_TH2 based on the charging voltage information IVC'. When the second discharge time taken for the charging circuit to be discharged from the second charging voltage V_C2 to the second threshold voltage V_TH2 is shorter than the second reference time interval TR2, the auxiliary power supply 100 may charge the charging circuit up to the third charging voltage V_C3 that is higher than the first charging voltage V_C1 by the first voltage amount DVC1 and the second voltage amount DVC2.

Although it is illustrated that the first voltage DVC1 and the second voltage DVC2 respectively having two different values are included in the charging voltage information IVC', embodiments are not limited thereto, and the charging voltage increment may be set to a single value. For example, the second charging voltage V_C2 may be higher than the first charging voltage V_C1 by the first voltage amount DVC1 and the third charging voltage V_C3 may be higher than the first charging voltage V_C1 by twice the first voltage amount DVC1.

Figure 10:
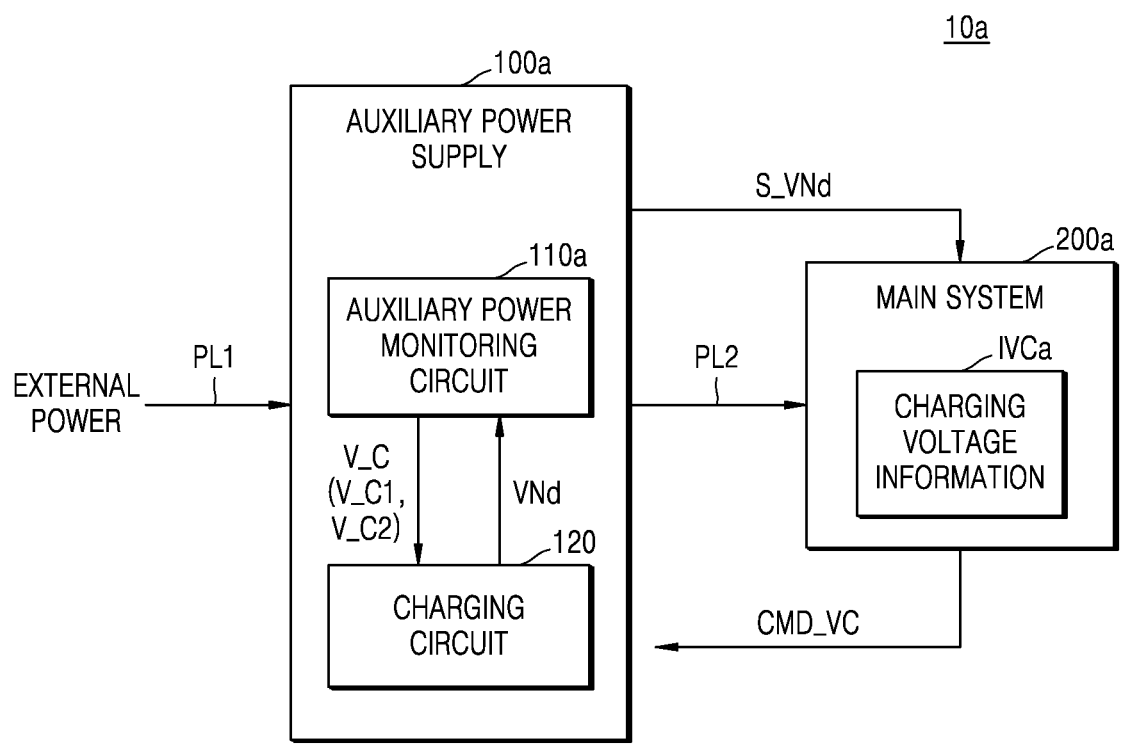
FIG. 10 is a block diagram of an electronic device according to an example embodiment.

FIG. 10 is a block diagram of an electronic device 10a according to an example embodiment. Redundant descriptions of like numerals in FIGS. 1 and 10 will be omitted.

Referring to FIG. 10, the electronic device 10a may include an auxiliary power supply (or, an auxiliary power supply circuit) 100a and a main system 200a. The auxiliary power supply 100a may supply an auxiliary power (or, an auxiliary voltage) to the main system 200a and the main system 200a may operate using the auxiliary power. The descriptions of the main system 200 of FIG. 4 may be applied to the main system 200a.

In an example embodiment, the electronic device 10a may include a storage device. For example, the electronic device 10a may include an SSD.

The auxiliary power supply 100a may include an auxiliary power monitoring circuit 110a and the charging circuit 120. The auxiliary power monitoring circuit 110a may store electric energy in the charging circuit 120 using external power and measure a voltage of the charging circuit 120.

The auxiliary power monitoring circuit 110a may charge electric energy in the charging circuit 120 using an external power (or, an external voltage) while the external power is being normally supplied to the auxiliary power supply 100a. The auxiliary power monitoring circuit 110a may enable the external power to be output to the second power line PL2 as a main power (or, a main voltage) and block the auxiliary power charged in the charging circuit 120 from being output to the second power line PL2. When the external power is not normally supplied to the auxiliary power supply 100a, the auxiliary power monitoring circuit 110a may block the main power from being output to the second power line PL2 and enable the auxiliary power in the charging circuit 120 to be output to the second power line PL2.

The auxiliary power monitoring circuit 110a may monitor the voltage of the charging circuit 120. In an example embodiment, the auxiliary power monitoring circuit 110a may measure the voltage VNd of the charging circuit 120 and transmit a capacitor voltage signal S_VNd corresponding to the voltage VNd of the charging circuit 120 to the main system 200a. In an example embodiment, the auxiliary power monitoring circuit 110a may measure a discharge time, which is taken for the voltage VNd of the charging circuit 120 to decrease from the charging voltage V_C (e.g., the first charging voltage V_C1) to a threshold voltage (e.g., the first threshold voltage V_TH1), and transmit information about the discharge time to the main system 200a.

The auxiliary power monitoring circuit 110a may control the charging voltage V_C provided to the charging circuit 120 in response to a charging voltage change command CMD_VC. For example, the auxiliary power monitoring circuit 110a may primarily charge the charging circuit 120 with the first charging voltage V_C1 and, when receiving the charging voltage change command CMD_VC, charge the charging circuit 120 with the second charging voltage V_C2. At this time, the level of the second charging voltage V_C2 may be higher than the level of the first charging voltage V_C1.

The main system 200a may operate using power supplied through the second power line PL2. The main system 200a may include hardware or software, each for controlling the auxiliary power supply 100a. The main system 200a may output the charging voltage change command CMD_VC to the auxiliary power supply 100a based on charging voltage information IVCa and a change in capacitance of the charging circuit 120.

In an example embodiment, the charging voltage information IVCa, i.e., information about the charging voltage V_C with respect to the change in capacitance of the charging circuit 120, may be stored in the main system 200a (e.g., the controller 220 in FIG. 4). In an example embodiment, the descriptions of at least one selected from the charging voltage information IVC of FIG. 7 and the charging voltage information IVC' of FIG. 9 may be applied to the charging voltage information IVCa.

The main system 200a may receive the capacitor voltage signal S_VNd and obtain information about the voltage change of the charging circuit 120. The main system 200a may detect a change in capacitance of the charging circuit 120 using the voltage change of the charging circuit 120. For example, the main system 200a may detect a change in capacitance of the charging circuit 120 by detecting a change in a discharge time taken for the voltage VNd of the charging circuit 120 to be discharged from the charging voltage V_C to the threshold voltage. When the capacitance of the charging circuit 120 is less than a reference capacitance, the main system 200a may output the charging voltage change command CMD_VC to the auxiliary power supply 100a.

In an example embodiment, the main system 200a may receive information about the discharge time, which is taken for the voltage VNd of the charging circuit 120 to be discharged from the charging voltage V_C to the threshold voltage, from the auxiliary power monitoring circuit 110a.

Figure 11A:
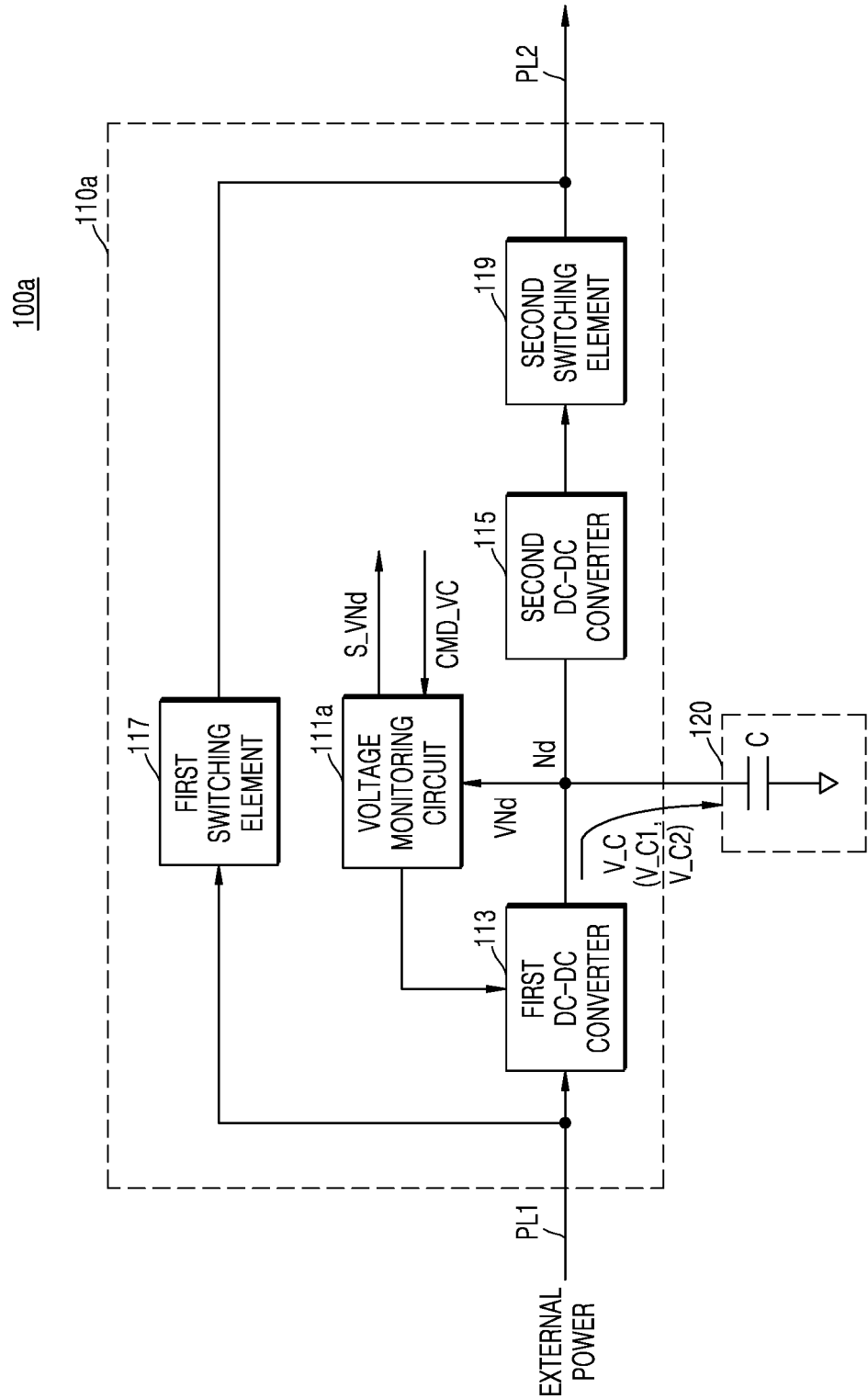
FIGS. 11A and 11B are block diagrams of auxiliary power supplies of an electronic device, according to example embodiments.
Figure 11B:
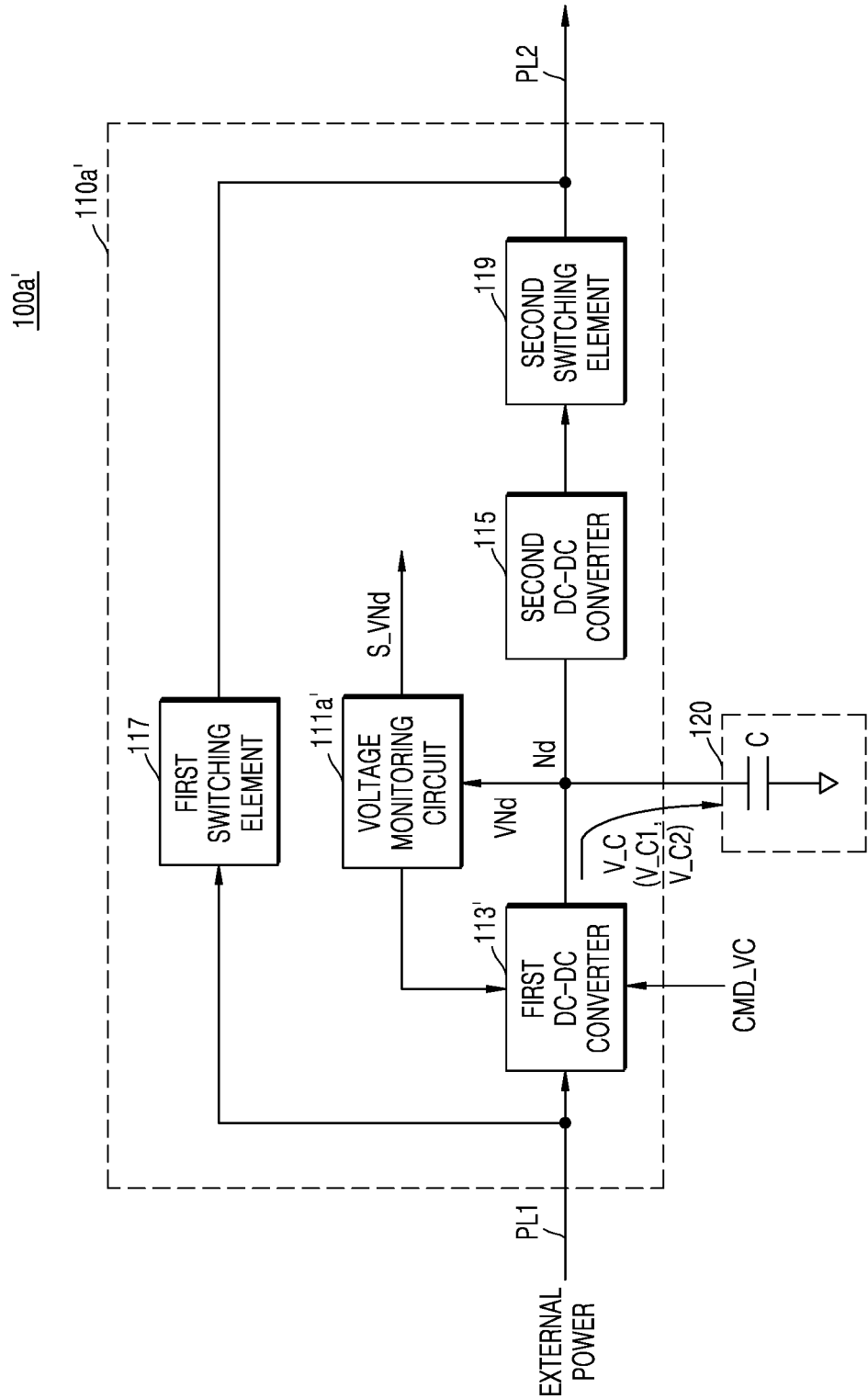

FIGS. 11A and 11B are block diagrams of auxiliary power supplies 100a and 100a' of the electronic device 10a, according to example embodiments. Redundant descriptions of like numerals in FIGS. 3, 11A, and 11B will be omitted.

Referring to FIG. 11A, the auxiliary power supply 100a may include the auxiliary power monitoring circuit 110a and the charging circuit 120. The auxiliary power monitoring circuit 110a may include a voltage monitoring circuit 111a, the first DC-DC converter 113, the second DC-DC converter 115, the first switching circuit 117, and the second switching circuit 119.

The voltage monitoring circuit 111*a* may measure a change in the voltage VNd of the charging circuit 120. The voltage monitoring circuit 111*a* may monitor the voltage VNd of the charging circuit 120. The voltage monitoring circuit 111*a* may transmit the capacitor voltage signal S_VNd corresponding to the voltage VNd of the charging circuit 120 to a controller of a main system. In an example embodiment, the voltage monitoring circuit 111*a* may measure a discharge time, which is taken for the voltage VNd of the charging circuit 120 to decrease from the charging voltage V_C (e.g., the first charging voltage V_C1) to a threshold voltage (e.g., the first threshold voltage V_TH1), and transmit information about the discharge time to the controller of the main system.

The voltage monitoring circuit 111*a* may control the first DC-DC converter 113 in response to the charging voltage change command CMD_VC. For example, the voltage monitoring circuit 111*a* may control the first DC-DC converter 113 such that the charging circuit 120 is primarily charged with the first charging voltage V_C1 and, when receiving the charging voltage change command CMD_VC, may control the first DC-DC converter 113 such that the charging circuit 120 is charged with the second charging voltage V_C2.

In an example embodiment, the capacitor voltage signal S_VNd, the information about the discharge time, and the charging voltage change command CMD_VC may be transmitted through a bus that transfers signals between the auxiliary power supply 100*a* and the controller of the main system. For example, the bus may transfer signals in an inter-integrated circuit (I2C) mode.

In an example embodiment, the first DC-DC converter 113 may convert the external power to the first charging voltage V_C1 and provide the first charging voltage V_C1 to the charging circuit 120. When the capacitance C (i.e., equivalent capacitance) of the charging circuit 120 is less than the first reference capacitance, the first DC-DC converter 113 may provide the second charging voltage V_C2, of which the level is higher than the level of the first charging voltage V_C1, to the charging circuit 120.

In an example embodiment, the auxiliary power monitoring circuit 110*a* may be implemented by a single chip. For example, the auxiliary power monitoring circuit 110*a* may form a PLP IC.

Referring to FIG. 11B, the auxiliary power supply 100*a*' may include an auxiliary power monitoring circuit 110*a*' and the charging circuit 120. The auxiliary power monitoring circuit 110*a*' may include a voltage monitoring circuit 111*a*', a first DC-DC converter 113', the second DC-DC converter 115, the first switching circuit 117, and the second switching circuit 119.

The voltage monitoring circuit 111*a*' may measure a change in the voltage VNd of the charging circuit 120. The voltage monitoring circuit 111*a*' may monitor the voltage VNd of the charging circuit 120. The voltage monitoring circuit 111*a*' may transmit the capacitor voltage signal S_VNd corresponding to the voltage VNd of the charging circuit 120 to a controller of a main system. In an example embodiment, the voltage monitoring circuit 111*a*' may measure a discharge time, which is taken for the voltage VNd of the charging circuit 120 to decrease from the charging voltage V_C to a threshold voltage, and transmit information about the discharge time to the controller of the main system.

The first DC-DC converter 113' may control the charging voltage V_C to be output in response to the charging voltage change command CMD_VC. For example, the first DC-DC converter 113' may primarily output the first charging voltage V_C1 and, when receiving the charging voltage change command CMD_VC, may output the second charging voltage V_C2.

In an example embodiment, the auxiliary power monitoring circuit 110*a*' may be implemented by a single chip. For example, the auxiliary power monitoring circuit 110*a*' may form a PLP IC.

Referring to FIGS. 11A and 11B, the auxiliary power supplies 100*a* and 100*a*' may prevent electric energy stored in the charging circuit 120 from decreasing by increasing the charging voltage V_C of the charging circuit 120 in stages as the capacitance C of the charging circuit 120 gradually decreases.

Figure 12:
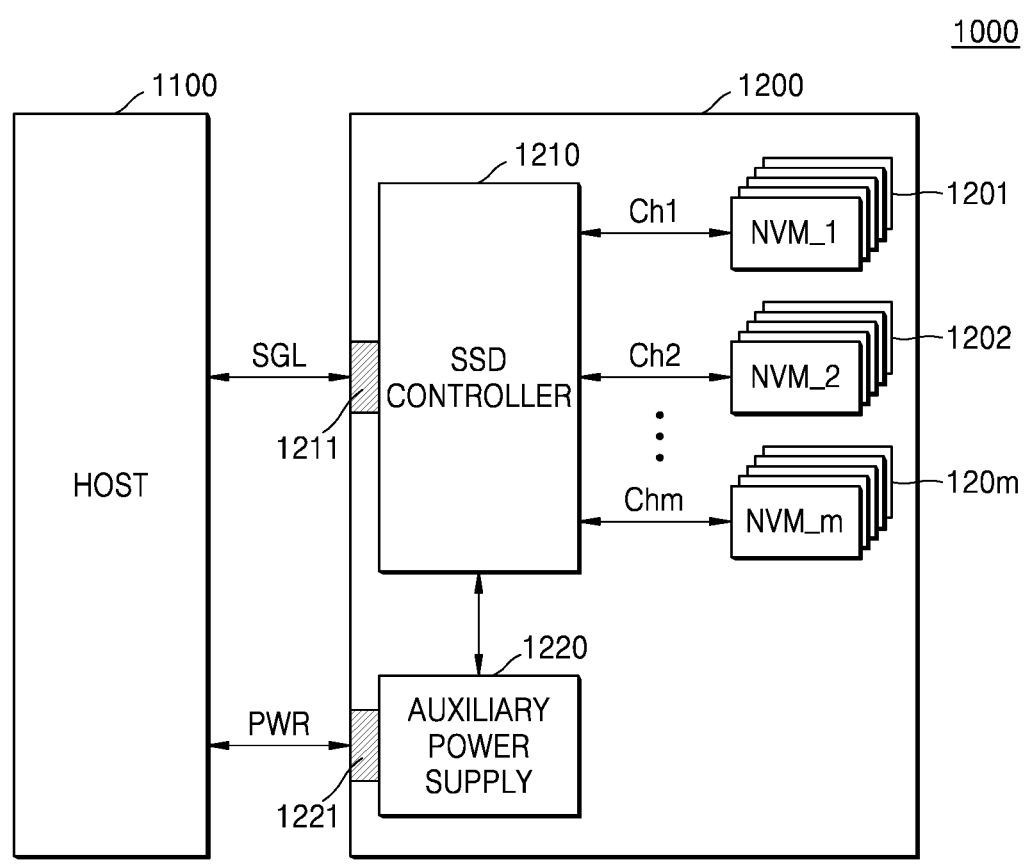
FIG. 12 is a block diagram of an example of applying an electronic device to a solid state drive (SSD), according to an example embodiment.

FIG. 12 is a block diagram of an example of applying the electronic device 10 or 10' to an SSD, according to an example embodiment.

Referring to FIG. 12, an SSD system 1000 may include a host 1100 and an SSD 1200. The SSD system 1000 may include at least one selected from the electronic device 10 of FIG. 1 and the electronic device 10*a* of FIG. 10.

The SSD 1200 may transmit and receive signals to and from the host 1100 through a signal connector 1211 and may receive power through a power connector 1221. The SSD 1200 may include a plurality of flash memories 1201 through 120*m*, an SSD controller 1210, and an auxiliary power supply 1220. The flash memories 1201 through 120*m* may be used as storage media of the SSD 1200. The SSD 1200 may use a non-volatile memory device, such as PRAM, MRAM, resistive RAM (ReRAM), or FRAM, besides flash memory. The flash memories 1201 through 120*m* may be connected to the SSD controller 1210 through a plurality of channels Ch1 through Chm, respectively. At least one flash memory may be connected to a single channel. Flash memories connected to one channel may be connected to one data bus.

The SSD controller 1210 may transmit and receive signals SGL to and from the host 1100 through the signal connector 1211. The signals SGL may include a command, an address, data, and so on. The SSD controller 1210 may write data to or read data from a certain flash memory according to a command from the host 1100.

The auxiliary power supply 1220 may be connected to the host 1100 through the power connector 1221. The auxiliary power supply 1220 may receive power PWR from the host 1100 and be charged with the power PWR. The auxiliary power supply 1220 may be arranged inside or outside the SSD 1200. For example, the auxiliary power supply 1220 may be arranged in a main board and may supply auxiliary power to the SSD 1200. The auxiliary power supply 1220 may include at least one selected from the auxiliary power supply 100 of FIG. 3, the auxiliary power supply 100*a* of FIG. 11A, and the auxiliary power supply 100*a*' of FIG. 11B.

When the capacitance of a charging circuit included in the auxiliary power supply 1220 gradually decreases, the SSD 1200 may increase the magnitude of voltage, with which the charging circuit is charged, in stages to prevent electric energy stored in the charging circuit from decreasing. Accordingly, the auxiliary power supply 1220 reliably supplies power to the SSD 1200, and therefore, the operational efficiency of the SSD 1200 may be prevented from decreasing and data stored in the SSD 1200 may be safely retained.

While the inventive concept has been particularly shown and described with reference to embodiments thereof, it will be understood that various changes in form and details may be made therein without departing from the spirit and scope of the following claims.

What is claimed is:

1. A method of providing an auxiliary power to a storage device including an auxiliary power supply circuit, a power management integrated circuit (PMIC), a controller, a first memory and a second memory, the method comprising:
receiving an external power at the auxiliary power supply circuit through a first power line;
providing the received external power to the PMIC of the storage device through a second power line;
converting the external power to a plurality of charging voltages;
providing a first charging voltage of the plurality of charging voltages to a charging circuit of the auxiliary power supply circuit, wherein the charging circuit includes at least one capacitor;
monitoring a change in capacitance of the charging circuit by measuring a voltage of the charging circuit;
storing information generated based on the change in capacitance of the charging circuit, in a voltage monitoring circuit of the auxiliary power supply circuit;
providing a second charging voltage of the plurality of charging voltages to the charging circuit when capacitance of the charging circuit is less than a first reference capacitance based on the information, wherein the second charging voltage is higher than the first charging voltage;
providing the auxiliary power generated based on the voltage of the charging circuit to the PMIC of the storage device through the second power line when sudden power off (SPO) occurs;
respectively providing the auxiliary power to the controller, the first memory and the second memory by through the PMIC of the storage device; and
measuring a discharge time taken to decrease from the voltage of the charging circuit to a first threshold voltage lower than the first charging voltage,
wherein the providing of the first charging voltage to the charging circuit is performed when the discharge time is longer than a first reference time interval, and
wherein the providing of the second charging voltage to the charging circuit is performed when the discharge time is shorter than the first reference time interval.

2. The method of claim 1, further comprising:
transferring the information between the auxiliary power supply circuit and the controller in an inter-integrated circuit (I2C) mode.

3. The method of claim 1,
wherein the providing of the second charging voltage of the plurality of charging voltages includes providing the second charging voltage of the plurality of charging voltages to the charging circuit, when the first charging voltage is lower than the maximum charging voltage.

4. The method of claim 3, further comprising:
when the first charging voltage is the maximum charging voltage and the capacitance of the charging circuit is less than the first reference capacitance, determining the charging circuit to be a failure.

5. The method of claim 1, further comprising:
providing a third charging voltage of the plurality of charging voltages to the charging circuit when the discharge time is shorter than a second reference time interval,
wherein the third charging voltage is higher than the second charging voltage, and wherein the second reference time interval is shorter than the first reference time interval.

6. The method of claim 1, wherein the information includes the discharge time.

7. A auxiliary power supply circuit comprising:
a charging circuit including at least one capacitor; and
an auxiliary power monitoring circuit connected to the charging circuit, the auxiliary power monitoring circuit configured to:
receive an external power through a first power line, and
provide the received external power or an auxiliary power to a power management integrated circuit (PMIC) through a second power line, and the auxiliary power monitoring circuit comprising:
a switching circuit configured to electrically connect the first power line to the second power line;
a converter configured to convert the external power to a charging voltage and provide the charging voltage to the charging circuit; and
a voltage monitoring circuit configured to monitor changes in capacitance of the charging circuit, and store information about the changes in capacitance of the charging circuit,
wherein the auxiliary power supply circuit is configured such that the voltage monitoring circuit controls the converter to provide, based on the information:
a first charging voltage to the charging circuit when the capacitance of the charging circuit is equal to or greater than a first reference capacitance, and
a second charging voltage higher than the first charging voltage to the charging circuit when the capacitance of the charging circuit is less than the first reference capacitance, and
wherein the auxiliary power supply circuit is configured:
to provide an auxiliary power generated based on the capacitance of the charging circuit to the PMIC through the second power line when sudden power off (SPO) occurs,
to measure a discharge time taken to decrease from a voltage of the charging circuit to a first threshold voltage lower than the first charging voltage, and
such that the voltage monitoring circuit further controls the converter to provide;
the first charging voltage to the charging circuit when the discharge time is longer than a first reference time interval, and
the second charging voltage to the charging circuit when the discharge time is shorter than the first reference time interval.

8. The auxiliary power supply circuit of claim 7, wherein the voltage monitoring circuit is configured to transfer the information between the auxiliary power supply circuit and a controller connected to the PMIC in an inter-integrated circuit (I2C) mode.

9. The auxiliary power supply circuit of claim 7, wherein the auxiliary power supply circuit is configured such that the voltage monitoring circuit controls the converter to provide the second charging voltage to the charging circuit when the first charging voltage is lower than the maximum charging voltage.

10. The auxiliary power supply circuit of claim 9, wherein the auxiliary power supply circuit is configured to inform outside of a failure of the charging circuit when the first charging voltage is the maximum charging voltage and the capacitance of the charging circuit is less than the first reference capacitance.

11. The auxiliary power supply circuit of claim 8, wherein the auxiliary power supply circuit is configured such that the voltage monitoring circuit controls the converter to provide a third charging voltage to the charging circuit when the discharge time is shorter than a second reference time interval,
    wherein the third charging voltage is higher than the second charging voltage, and
    wherein the second reference time interval is shorter than the first reference time interval.

12. The auxiliary power supply circuit of claim 8, wherein the information includes the discharge time.

\* \* \* \* \*